United States Patent [19]

Lin

[11] Patent Number: 4,502,225
[45] Date of Patent: Mar. 5, 1985

[54] MECHANICAL SCRIBER FOR SEMICONDUCTOR DEVICES

[75] Inventor: Peter T. Lin, East Brunswick, N.J.
[73] Assignee: RCA Corporation, New York, N.Y.
[21] Appl. No.: 492,043
[22] Filed: May 6, 1983
[51] Int. Cl.³ .......................................... B43L 13/00
[52] U.S. Cl. .................................. 33/18 R; 33/32 R
[58] Field of Search .................. 33/18 R, 19 R, 19 A, 33/32 R, 32 B, 32 C, 32 D, 26, 27 C, 27 D, 27 R, 21, 30

[56] References Cited

U.S. PATENT DOCUMENTS

| | | | |
|---|---|---|---|
| 1,259,687 | 3/1918 | Waterloo | 33/32 D |
| 1,356,796 | 10/1920 | Sommer et al. | 33/26 |
| 2,667,691 | 2/1954 | Marton | 33/32 C |
| 3,094,785 | 6/1963 | Kulicke | 33/19 A X |
| 4,292,092 | 9/1981 | Hanak | 148/1.5 |

OTHER PUBLICATIONS

IBM, Tech. Disclosure Bulletin, "Scribe Point" by M. F. Rose, vol. 11, #12, 5/69.

Primary Examiner—Harry N. Haroian
Attorney, Agent, or Firm—Birgit E. Morris; Donald S. Cohen; Joseph D. Lazar

[57] ABSTRACT

A mechanical scriber using a scribing tip, such as a diamond, provides controlled scriber forces with a spring-loaded compound lever arrangement. The scribing force and range of scribing depth are adjusted by a pair of adjustable micrometer heads. A semiconductor device, such as a multilayer solar cell, can be formed into scribed strips at each layer.

4 Claims, 5 Drawing Figures

MECHANICAL SCRIBER FOR SEMICONDUCTOR DEVICES

The Government of the United States of America has rights in this invention pursuant to SERI Subcontract No. XG-1-1169-1, awarded by the United States Department of Energy under Contract No. EG-77-C-01-4042.

This invention relates to a mechanical scriber for scribing semiconductor devices such as solar cells.

BACKGROUND OF THE INVENTION

In the manufacture of semiconductor devices such as solar cells, the final device is separated into discrete elements or sections typically by scribing followed by fracturing or cracking the device. The present state of the art utilizes any of the known forms of scribing such as lasers, chemical etching and mechanical scribers. Reference is made to U.S. Pat. No. 4,292,092 issued Sept. 29, 1981 for a description of a process for forming the interconnection of thin film solar cells using a laser for scribing one or more of the thin layers that comprise a solar cell. Mechanical scribers have not been too popular for this application because of the difficulty in controlling the cut into the materials to precise depths and widths. There is a need in the art for a mechanical scriber that can provide accurate cuts in depth and width into semiconductor surfaces such as surfaces of solar cells.

SUMMARY OF THE INVENTION

According to the invention, a mechanical scriber is formed of a spring-loaded double lever arm arrangement in which the downward force of a scriber tool is controlled to a predetermined scribe force.

DETAILED DESCRIPTION OF THE PREFERRED EMBODIMENT OF THE INVENTION

Figure 1:
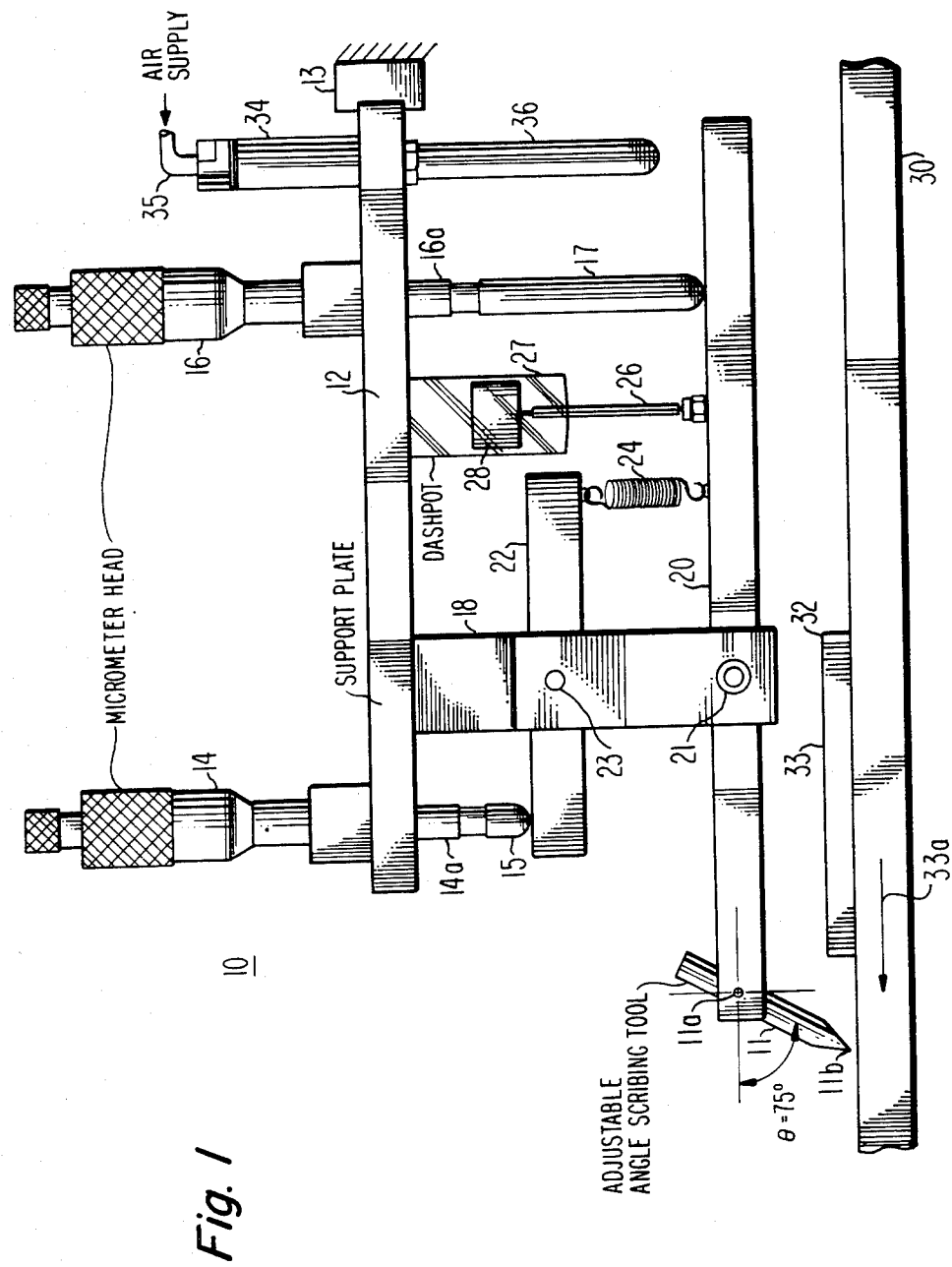
FIG. 1 is a schematic in side elevation of the mechanical scriber of the invention.

Scriber 10 as shown in FIG. 1 utilizes a scribing tool 11, typically one inch long with a ⅛" shank, such as a diamond having a tip 11b, carried by a compound spring-loaded lever arm system that provides for controlled and accurate downward cutting force of the tip 11b. The scriber 10 utilizes a support plate 12 fixed to a housing 13 over a manual or computer-controlled x-y table 30 carrying a device 32 to be scribed. A first micrometer head 14 provides fine adjustments within a ½ inch (1.25 cm) range of vertical longitudinal movements of a rod 14a capped by a spherical cap 15. Cap 15 contacts one end of a spring-loaded arm 22 pivoted about a vertical pedestal 18 attached to the surface support plate 12. Arm 22 pivots about a shaft 23 which may or may not be provided with bearings. The other end of the arm 22 is resiliently connected to a corresponding end of tool arm 20 by means of a tension spring 24. Attached to the other end of arm 20 is the scribing tool 11, having a conical shaped diamond tip 11b pivotally adjusted about shaft 11a to a desired fixed angle $\theta$ of inclination. In the embodiment illustrated, $\theta$ is preferably 75°. The arm 20 is positioned in parallel with arm 22 and is pivoted about pedestal 18 by shaft 21 preferably provided with bearings to provide a very low friction pivot of the arm 20 relative to the pedestal 18. Arm 20 is thus free to pivot about shaft 21 subject only to the spring force of spring 24. Shafts 21 and 23 are parallel to the plane of plate 12 and table 30.

A second micrometer head 16 is attached to support plate 12. Micrometer head 16 is provided with a rod 16a moveable longitudinally in a vertical path and having an end portion cap 17 for contacting the arm 20. Head 16 is also adjustable to provide adjustments in the extension or retraction of the rod 16a and thus the cap 17 relative to the arm 20 in "microinch" movements. An air cylinder 34, in response to air supplied via duct 35 from an air supply, not shown, actuates a rod 36 to press downwardly on the lever arm 20. The lever arm 20 when thus contacted is pivoted to lift the tool 11 from the surface 32 when it is desired to have the tool 11 not engaged to the surface 33 of the device 32.

A dash-pot 27 having a piston 28 connected to a rod 26 serves to damp and thereby render smooth movements of the vertical excursions of lever arm 20 and thus of the tool tip 11b as it scribes the device surface 33.

Figure 2A:
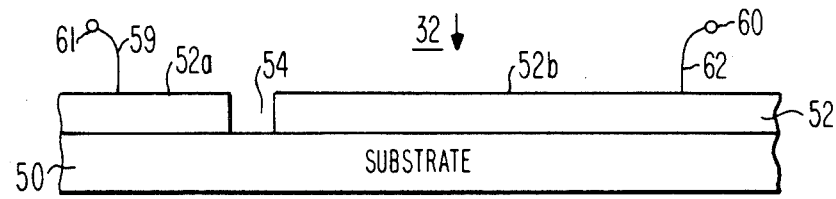
FIGS. 2a, 2b and 2c illustrate the process of fabricating a series of layers each provided with scribes suitable for use in practicing the invention in series-interconnected thin film solar cell fabrication.
Figure 2B:
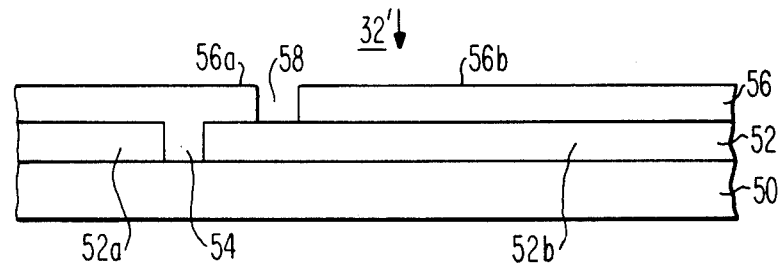
Figure 2C:
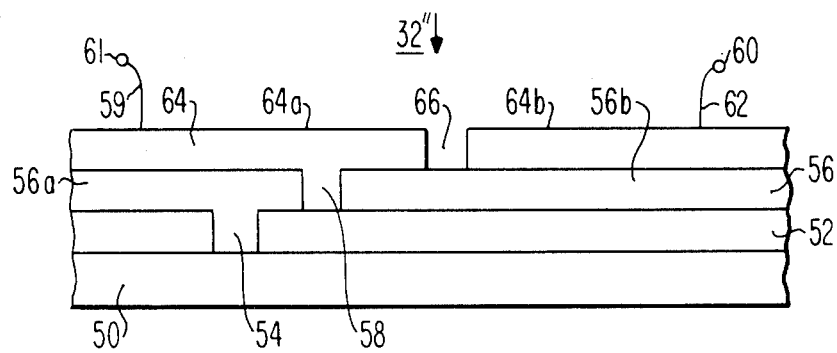

The operation of the scriber 10 will now be described with reference to FIGS. 2a through 2c illustrating the processing of a multilayer device useful in the solar cell field. A layer of a conductive transparent oxide (CTO) 52 such as tin oxide is deposited on a substrate 50 of glass of ⅛ inch (0.3 centimeters) thickness. The thickness of the CTO layer 52 is about 750 angstroms. The layer 52 is provided with one or more scribes 54 separating or dividing the layer 52 into strips 52a, 52b, etc.

The scribe 54 is made by the scriber 10 by placing the device 32 comprising the substrate 50 and the oxide layer 52 on the x-y table 30. The device into which the solar cell is to be developed shall be labeled 32 in FIG. 2a, 32' in FIG. 2b and 32" in FIG. 2c. In general, as illustrated in FIG. 1, any device 32 having a surface 33 can be scribed by the scriber 10 of the invention.

The device 32 is clamped onto the table 30 and is arranged to be moved in the direction shown by arrow 30a in FIG. 1 under the scribing tool 11 in a sequence of scans and in such a manner that a plurality of scribe lines 54 (FIG. 2a) are generated on the surface 33 of the device. Before starting the scribing operation, the initial position of tool 11 is adjusted by manually operating head 16 so as to pivot arm 20 whereby the tip 11b is biased to a position about 0.02 inch (0.05 centimeter) below the expected elevation of the surface 33 of the device when in place on table 30. This tip bias positioning step is done to compensate for surface roughness or unevenness of the device surface 33 to thereby assure that the tip 11b will scribe a line into the surface 33 regardless of the roughness thereof. This, in effect, preloads the tool 11 so that the tip 11b rides on the device surface 33 under the biasing force of the tension of spring 24. Note that the positioning biasing of the tool 11 by adjustment of head 16 is insignificant in comparison to the amount of spring force required to scribe the surface 33 to thereby separate or divide the layer into a series of strips.

As the device 32 is moved under manual or computer control of table 30 under the tip 11b, surface 33 is scribed by tool 11 to develop a scribe across the surface and into the layer beneath the surface 33. The scribe 54 can be monitored by microscope observation or by measuring while scribing the electrical conductivity or resistance through the layer 52 across the scribe 54. For monitoring by electrical measurement, wires 59 and 62 are attached to the surface of layer 52 at locations on respective portions to terminals 60 and 61, which, in turn, are connected to a suitable resistance or conductance meter, not shown. When the scribe 54 completely separates the layer 52 into strips 52a and 52b the resistance value across the scribe, for example, will be "infinity." The scribe 54 as illustrated in FIG. 2a illustrates one scan of the device 32 as it was moved under the tip 11b separating thereby the CTO layer 52 into strips 52a and 52b. At the end of the scan over surface 33, the air cylinder 34 is actuated to cause the rod 36 to press down on the arm 20 to lift the tip 11b from the surface 33 thereby allowing the table 30 to be repositioned so the device 33 is again at the starting position but one scribe line removed from the original starting position to again scribe another scribe 54 parallel to the first scribe. With the device 32 repositioned, the air cylinder 34 is deenergized to allow the arm 20 to assume its initial position under the force of spring 24 but limited by the position of cap 17 to thereby allow the scribing of the second scribe in the device 32. As the device 32 is moved under the tip 11b under the force of spring 24 a dash pot 27 serves to minimize the vertical excursions of the tool 11 to effect a substantially smooth scribing action.

In practicing the invention, the micrometer head 14 is adjusted so that the force on spring 24 provides the desired vertical force of the tool 11 against the surface 33. The micrometer head 16 is also adjusted to establish the maximum depth that the tool 11 will cut into the surface 33 as described hereinabove.

The tool angle $\theta$ is also adjusted to the desired angle. It has been found to be 75° for most uses of the invention. The angle $\theta$ depends, also in part, on the form of the tool tip 11b. Tip 11b is preferably conical in shape having a rounded or spherical end with a radius on the order of 0.0002 to 0.002 inch. In addition to rounded tips, experiments were performed with the tip 11b in the form of a pyramid. In particular, three different scribing tools were used. One was a 4-point truncated diamond tip, another, a conical diamond tip, and finally one shaped as a keel diamond tip. All three tips operated adequately although the rounded tip is preferred.

The path of each scribe in fabricating solar cells is typically linear. A plurality of such scribe lines, each spaced apart from the respective adjacent scribes define the strips 52a, 52b, etc. The invention can be used to pattern a semiconductor device without the need of a mask as is usually required for other scribing processes, such as optical and chemical, by programming the movement of table 30. The tip 11b, under proper force from spring 24 and depth bias by head 16, will accordingly scribe the device along a path according to the relative movement of the device 33.

EXAMPLES

Several examples illustrating the use of the invention will now be described by further reference to FIGS. 2a through 2c. The invention was used to scribe several layers of a so-called tandem junction solar cell battery of the type described in U.S. Pat. No. 4,292,092 issued Sept. 29, 1981 to J. J. Hanak. In this Hanak patent, the solar cells were fabricated with semiconductor materials in accordance with U.S. Pat. No. 4,064,521, issued on Dec. 20, 1977, and U.S. Pat. No. 4,272,461, issued June 9, 1981. The CTO layer was formed of tin oxide as described in co-pending U.S. patent application Ser. No. 424,137, filed Sept. 27, 1982 by J. Kane. All of these patents and patent application are incorporated by reference herein. A preferred form of such a solar cell was formed of amorphous silicon fabricated with suitable modifiers, in addition to hydrogen, as now well known in the art.

Thus, the device 32 as illustrated in FIG. 2a, was provided with the desired scribe lines 54 in the layer 52 of the conductive transparent oxide (CTO). Then, a layer 56 of amorphous silicon of about 5,000 angstroms in thickness was deposited over the scribed strips 52a, 52b etc. of the device as shown in FIG. 2b. The scribe 54 also received the amorphous silicon.

Scribe lines 58 were provided in the layer 56 in the manner described hereinabove with a plurality of scans made over the amorphous silicon layer 56 defining strips 56a, 56b etc. Because the amorphous silicon material over the conductive layer 52 of CTO is very insulating, the electrical resistance technique of monitoring the insulating layer 52 for determining when the scribe 58 has adequately separated the layer 56 into strips 56a and 56b cannot be used. Accordingly, only optical techniques using microscope observations are used to determine the separation of the strips of amorphous silicon over a CTO layer.

The next step of the process as shown in FIG. 2c involved adding the layer of metal 64 to the device 32' of FIG. 2b. Metal will fill the scribe 58. Such a metallic layer 64 consists of a film of aluminum or a film of aluminum on a film of titanium. The metal layer 64 as deposited over the amorphous silicon layer 56 is then scribed, with scribe lines 56 as shown in FIG. 2c, in a plurality of scans as described above. It will be noticed that the scribes 54, 58 and 66 are staggered to each other to provide for the tandem connections required to develop the solar cell as described in the aforementioned U.S. Pat. No. 4,292,092. Thus, the scribes completely separate each portion of a layer from the other portions of the layer to allow for the tandem connections. The scribing action on the metal layer 64 is monitored by electrical means comprising the leads 59 and 62 extending from the surface of the layer 64 to terminals 60 and 61 for connection to a suitable meter as described above.

Figure 3:
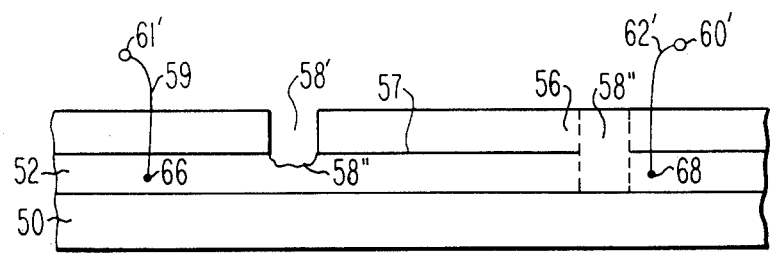
FIG. 3 is a schematic of a modified form of the device of FIG. 2b used to illustrate the calibration of the scriber of the invention.

While the invention has been described to provide scribes in all layers of the multilayer semiconductor device, the invention has been found particularly useful in scribing an amorphous silicon layer, such as layer 56. In this regard several tests were performed to determine the threshold value of the scribing forces needed to provide the desired scribe 58 for the amorphous layer 56. The specimen solar cells were developed on a $3 \times 3 \times 1/16$ inch glass substrate 50 as illustrated in FIG. 3. A CTO layer 52 was provided first using only tin oxide and then using only indium tin oxide. Different sizes of conical shape diamond tips 11b were used. One had a tip radius of 0.0005 inch and the other had a radius of 0.0002 inch. The angle $\theta$, known as the back-racking angle, was set at 75°. The thickness of the silicon layer 56 was 0.4 microns. The scribing forces were selected within a range of 3 to 33 grams. The layer 56 was successfully scribed in all of the experiments adequately to define a scribe 58' that separated the layer into well defined strips. The scribing action was monitored by electrical continuity tests using wires 59' and 62' connecting the portion of the layer 52 at respective portions 66 and 68 to the terminals 60' and 61' as shown in FIG. 3. A meter (not shown) was used to indicate when the scribe line 58' separated the layer 56 into strips. All of the lines 58' were 0.5 mils wide.

The same experiment was performed on a different portion of the surface 56 with a sharper diamond tip 11b rounded with a radius of 0.0002 inch. This experiment showed that the resistivity across the layer 52 started to increase at about 33 grams indicating that some damage into the surface of layer 52 was caused by the tip 11a cutting deeply therein. Thus, a layer of amorphous silicon of the thickness and composition used for the experiment indicated that a tip of 0.0005 inch was needed to be assured that the scribed lines 58' would not cut too deep into a layer 52 of CTO formed on indium tin oxide.

The second sample of a cell comprising a glass deposited with CTO formed of tin oxide was performed in which the layer 56 was also of amorphous silicon, as described hereinabove. The tip 11b was 0.0005 inch in radius and scribing forces within the range of 3 to 28 grams were used. A sharper tip 11b also was used with a radius of 0.0002 inch. It was shown that scribe lines 58' for the larger tip were developed clearly to separate the layer 56 into well defined strips without damaging the layer 52. However, with the 0.0002 inch tip the layer 52 was damaged immediately both with three grams of force and with eight grams. The separation of the layer by the sharp tip is as indicated by scribe 58" shown by dotted lines in FIG. 3. Thus, it is clear that the sharper tip 11b should not be used for tin oxide CTO layer 52 in combination with an amorphous silicon layer 56.

After many experiments it has been determined that the scriber 10 when used for developing solar cell devices, should use 100 grams for force of CTO layers, 30 grams of force for amorphous silicon layers and the range of 125 and 150 grams force for metallic layers comprising a film aluminum over a film of titanium. It will be appreciated that the hardness of the titanium relative to the more ductile and less hard surface of aluminum is the reason why a very large force is needed to scribe the metallic layer with titanium. It should be appreciated thus that the invention has to be used with an understanding of the relative hardness of the subsurfaces to which a scribe line is to be developed in a surface thereover. It is relatively easy, thus, to provide a scribe line in a relatively soft surface that is overlying a hard surface. The invention is particularly useful, thus, in developing scribe lines in a solar cell using amorphous silicon overlying a CTO layer.

While the invention is described for use in scribing solar cell strips, it may be used to scribe patterns in the semiconductor art in any desired pattern. For such applications suitable control of the x-y table 30 can be provided to move the device 32 under the tool 11 in the desired pattern.

Moreover, in order to remove debris from the surface caused by the scriber, gas under pressure in conjunction with a vacuum hose may be used to blow the material into the vacuum hose. The material is carried by the vacuum hose to a suitable depository.

What is claimed is:

1. A mechanical scriber for scribing a layer of material of a device comprising:
    (a) a fixed planar support;
    (b) a scribing tool;
    (c) a first arm pivotal about a first axis spaced from and generally parallel to the plane of said support;
    (d) a second arm pivotal about a second axis parallel to said first axis;
    (e) said tool being connected to one end of said first arm and a spring connected between the other end of said first arm and one end of said second arm;
    (f) cutting depth adjusting means comprising a first extensible member adjustable by first micrometer means to contact the other end of said first arm to limit the pivot thereof and thereby limit the cutting depth of said tool to a precise desired depth; and
    (g) scribing force adjusting means comprising a second extensible member adjustable by second micrometer means to contact the other end of said second arm to adjust selectively the force of said spring to limit the scribing force of said tool to a precise predetermined value.

2. The scriber of claim 1 further including means to override said spring and thereby pivot said first arm sufficiently to lift said tool from said layer.

3. The scriber of claim 2 further including a dashpot mechanism connected to a member riding on said first arm to provide smooth vertical excursions of said tool over said layer.

4. The scriber of claim 1 further including means for adjusting the back-raking angle of said tool relative to said layer.

* * * * *